United States Patent [19]

Matsubara

[11] Patent Number: 6,037,250
[45] Date of Patent: Mar. 14, 2000

[54] PROCESS FOR FORMING MULTILEVEL INTERCONNECTION STRUCTURE

[75] Inventor: Yoshihisa Matsubara, Tokyo, Japan

[73] Assignee: NEC Corporation, Tokyo, Japan

[21] Appl. No.: 09/300,258

[22] Filed: Apr. 27, 1999

[30] Foreign Application Priority Data

Apr. 30, 1998 [JP] Japan .................................. 10-120495

[51] Int. Cl.[7] .......................... H01L 21/28; H01L 21/302
[52] U.S. Cl. .......................... 438/622; 438/629; 438/633; 438/637; 438/687; 438/714
[58] Field of Search .................... 438/622, 624, 438/627, 629, 633, 637, 687, 710, 714

[56] References Cited

U.S. PATENT DOCUMENTS

| | | | |
|---|---|---|---|
| 5,294,292 | 3/1994 | Yamashita et al. | 156/643 |
| 5,561,082 | 10/1996 | Matsuo et al. | 438/687 |
| 5,744,376 | 4/1998 | Chan et al. | 438/687 |
| 5,817,572 | 10/1998 | Chiang et al. | 438/624 |
| 5,891,799 | 4/1999 | Tsui | 438/624 |
| 5,909,637 | 6/1999 | Charneski et al. | 438/687 |

FOREIGN PATENT DOCUMENTS

0 680 085  11/1995  European Pat. Off. .

Primary Examiner—T. N. Quach
Attorney, Agent, or Firm—Foley & Lardner

[57] ABSTRACT

A method for forming a multi-level copper interconnection structure includes the steps of etching an interlayer dielectric film using a photoresist mask to form an opening for exposing a copper interconnect, and removing the photoresist mask by a plasma ashing at a substrate temperature lower than 150° C. and a RF power not higher than 0.7 watts/cm$^2$. The plasma ashing prevents formation of a copper oxide film on the surface of the copper interconnect thereby reducing the contact resistance between the via plug and the copper interconnect.

7 Claims, 6 Drawing Sheets

PROCESS FOR FORMING MULTILEVEL INTERCONNECTION STRUCTURE

BACKGROUND OF THE INVENTION (a) Field of the Invention

The present invention relates to a process for forming multilevel interconnection (wiring) structure for a semiconductor device and, more particularly, to a process for forming a multilevel interconnection structure having a copper layer for a lower electric resistance and a higher layout density.

(b) Description of the Related Art

In a conventional wiring process employed in fabrication of a semiconductor device, an aluminum or aluminum alloy layer is subjected to photolithographic and etching steps so as to form first level interconnects. Then, an interlevel dielectric film is deposited on the first level interconnects, followed by flattening thereof. Subsequently, a via hole is formed in the interlevel dielectric film and is filled with a tungsten plug. An aluminum or aluminum alloy layer is then deposited on the interlevel dielectric film and is subjected to photolithographic and etching steps so as to form second level interconnects.

As the number of interconnect levels of a multilevel interconnection structure increases, the process for fabrication of semiconductor devices becomes complex due to an increase in the number of photolithographic and etching steps. Also, as the pitch of interconnects becomes finer, the coverage of the interlevel dielectric film tends to become incomplete to form voids therein.

In a current generation of semiconductor devices having a line width of 0.18 $\mu$m to 0.20 $\mu$m, the pitch of interconnects is reduced to increase the parasitic capacitance between the interconnects, whereby the performance of the semiconductor devices tend to be deteriorated due to a large RC time constant. One solution for this problem is provision of copper interconnects having a lower electric resistance than aluminum or aluminum alloy interconnects. However, the difficulty of etching control in copper property prevents an ordinary etching process, such as a combination of deposition and subsequent etching steps, from being employed.

A damascene process is of particular interest as a process for forming a multilevel copper interconnection structure. Formation of the multilevel copper interconnection structure by the damascene process will next be described with reference to FIGS. 1A–1I.

Figure 1A:
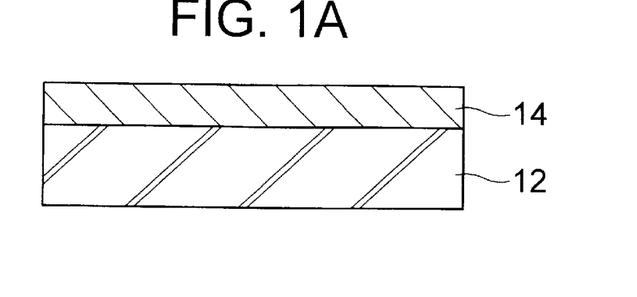
FIGS. 1A–1I are sectional views of a wafer showing the steps of a conventional process and a process according to an embodiment of the present invention for forming a two-level copper interconnection structure.

Referring to FIG. 1A, a first $SiO_2$ film, such as BPSG (borophospho-silicate glass) film 14 is formed on a silicon substrate 12. A via hole (not shown) is formed in the first $SiO_2$ film 14 so as to expose a portion of diffused region (source/drain region) of the silicon substrate 12. A conductive plug (not shown), such as a tungsten plug, is then formed in the via hole for connection of the diffused regions with overlying interconnects.

Figure 1B:
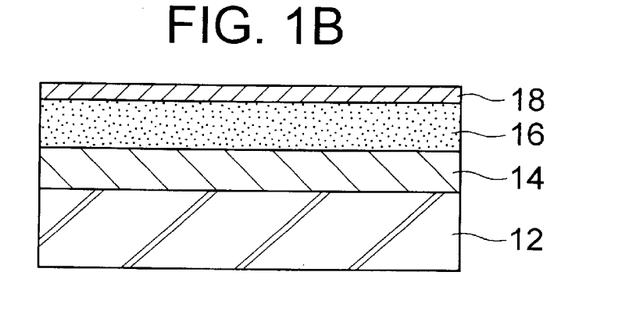

Subsequently, as shown in FIG. 1B, a second $SiO_2$ film 16 is formed on the first $SiO_2$ film 14 by a plasma CVD process. The plasma CVD process uses, for example, silane ($SiH_4$) and oxygen ($O_2$) as reactive gases.

Figure 1C:
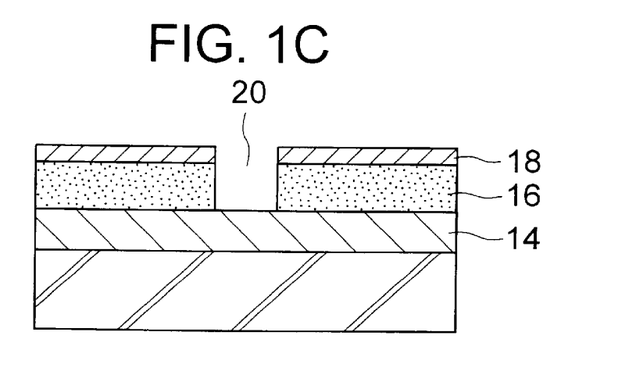

Next, as shown in FIG. IC, a photoresist film 18 is formed on the second $SiO_2$ film 16. The photoresist film 18 is subjected to patterning by photolithographic and etching steps to be formed into a patterned mask 18 having a pattern thereon for interconnects. Subsequently, the second $SiO_2$ film 16 is etched using the patterned mask 18 as an etching mask, thereby forming a wiring trench 20, which exposes at the bottom thereof the conductive plug (not shown) formed in the $SiO_2$ film 14.

Then, the mask 18 is removed by oxygen plasma ashing using a plasma ashing system, such as having parallel-plate electrodes. An RF voltage is applied for the ashing between the top electrode and the bottom electrode of the plasma ashing system.

Figure 1D:
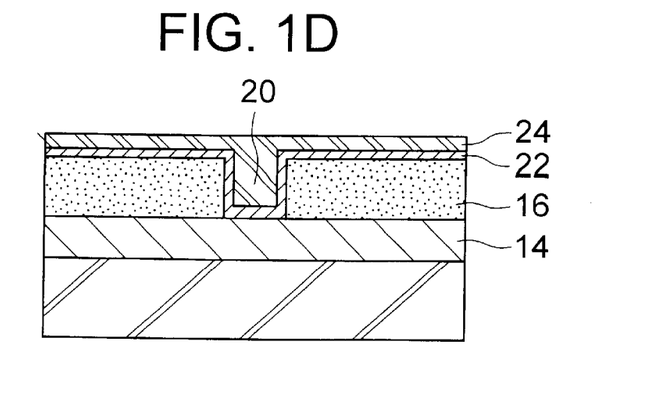

Subsequently, as shown in FIG. 1D, a TiN film 22 serving as a barrier layer is blanket-deposited on the wafer. Further, a copper layer 24 is deposited on the TiN film 22 to fill the wiring trench 20.

Figure 1E:
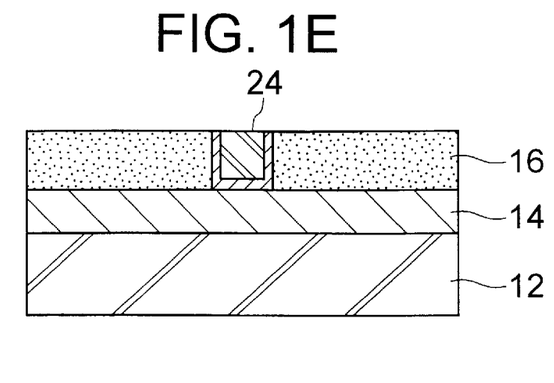

Then, the copper layer 24 and the TiN film 22 are subjected to a chemical-mechanical polishing (CMP) step until the top of the $SiO_2$ film 16 is exposed, thereby forming first level copper interconnects 24 in the trench as shown in FIG. 1E. The first level copper interconnects 24 are in electrical contact with the conductive plug (not shown) at the bottom thereof, are exposed at the top surface of the copper interconnects, and are embedded in the $SiO_2$ film 14.

Figure 1F:
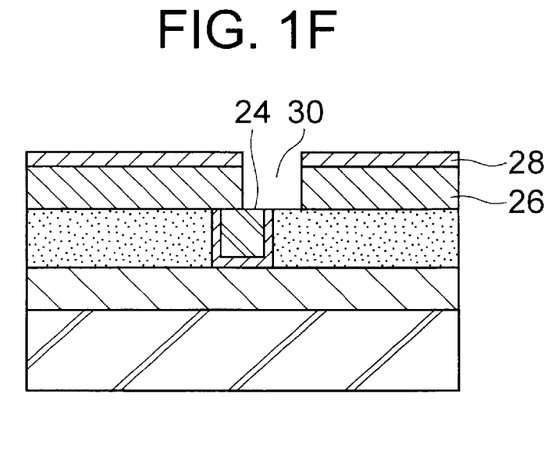

Further, a third $SiO_2$ film, such as BPSG film, 26 is formed on the second $SiO_2$ film 16 and the first level interconnects 24. A photoresist film 28 is then formed on the second $SiO_2$ film 26. The photoresist film 28 is subjected to patterning so as to be formed into a patterned mask 28. Next, as shown in FIG. 1F, the third $SiO_2$ film 26 is selectively etched by a plasma etching process using the patterned mask 28 as an etching mask, thereby forming a via hole 30 which exposes the top of the first level copper interconnects 24.

Subsequently, the patterned mask 28 is removed by oxygen plasma ashing under specified ashing conditions similar to those employed for the patterned mask 18. During the oxygen plasma ashing process, the first level copper interconnects 24 are exposed to an oxygen plasma ambient through the via hole 30.

Figure 1G:
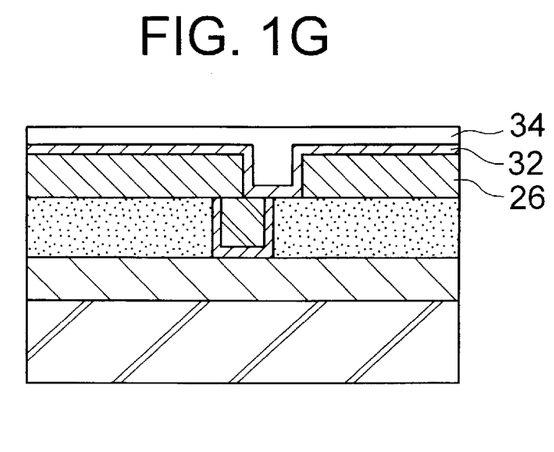

Then, as shown in FIG. 1G, a TiN film 32 serving as a barrier layer is blanket-deposited on the wafer, followed by deposition of a tungsten layer 34 on the TiN film 32.

Figure 1H:
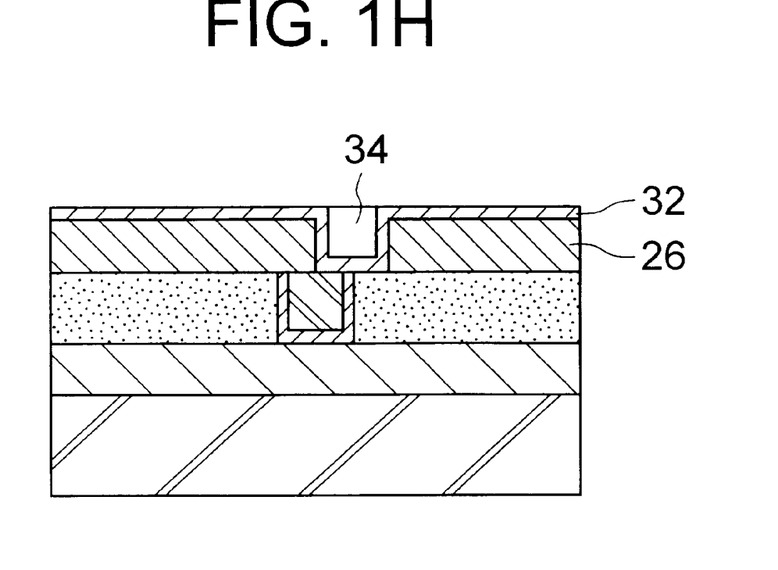

The TiN film 32 and the tungsten layer 34 are then subjected to a CMP process until the top of the third $SiO_2$ film 26 is exposed, thereby leaving a tungsten plug 34 filling the via hole 30 as shown in FIG. 1H.

Figure 1I:
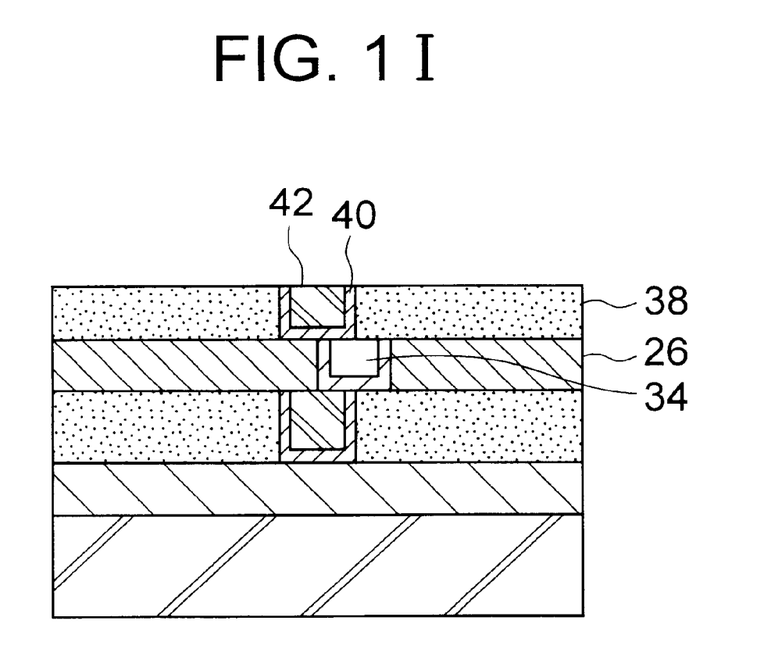

Further, a fourth $SiO_2$ film 38 is formed on the third $SiO_2$ film 26 by a plasma CVD process. As in the case of the first level copper interconnects 24, a wiring trench is formed in the fourth $SiO_2$ film 38. A TiN film 40 is formed on the fourth $SiO_2$ film 38, followed by deposition of another copper layer 42 on the TiN film 40. The TiN film 40 and the copper layer 42 are subjected to a CMP process so as to leave second level copper interconnects 42 in the trench. In order to remove the etching mask after formation of the wiring trench, oxygen plasma ashing is performed under specific ashing conditions similar to those employed for removal of the masks 18 and 28. During the oxygen plasma ashing process, the tungsten plug 34 is exposed to an oxygen plasma ambient through the wiring trench in the fourth $SiO_2$ film 38.

The above-described damascene process for forming a multilevel copper interconnection structure involves an unavoidable increase in the electric resistance of the first and the second level copper interconnects and an increase in the contact resistance between the interconnects and the tungsten plug.

Such an increase in electric resistance or contact resistance restricts the implementation of a finer pitch of the interconnects and a larger number of levels in the multilevel interconnection structure, thereby hindering the implementation of a semiconductor device of higher integration.

The above problem also arises in a conventional ordinary process including the steps of: forming a copper layer; subjecting the copper layer to patterning to form copper interconnects; embedding the copper interconnects with an interlevel dielectric film; transferring a via-hole pattern onto the interlevel dielectric film; and forming the via holes.

SUMMARY OF THE INVENTION

In view of the foregoing, an object of the present invention is to provide a process for forming a multilevel copper interconnection structure having a lower electric resistance and a lower contact resistance of the interconnects.

The present invention provides a method for fabricating a multilevel interconnection structure for a semiconductor device, comprising the steps of forming first level interconnects having a top copper layer and overlying a substrate, forming a first interlayer dielectric film on the first level interconnects, forming a photoresist mask on the first interlayer dielectric film, the photoresist mask having an opening overlying a portion of the first level interconnects, selectively etching the first interlayer dielectric film by using the photoresist mask to form a via hole for exposing the portion of the first level interconnects, removing at least a top portion of the photoresist mask by using a plasma ashing at a substrate temperature lower than 160° C. and a RF power not higher than about 0.7 watts/cm$^2$ of the substrate, and forming second level interconnects connected to the first level interconnects via the via hole.

In accordance with the process of the present invention, at least a top portion of the etching mask is removed by the oxygen plasma ashing while exposing the copper interconnects to an oxygen plasma ambient. The oxygen plasma ashing process, performed at a substrate temperature which is lower than 160° C. and an RF output power per unit area of wafer surface which is not higher than 0.7 W/cm$^2$, prevents oxidation of the copper interconnects and implements a multi-level copper interconnection structure having lower electric resistance. By using the method of the present invention, the integration or layout density of a semiconductor device can be improved.

The process of the present invention for forming copper interconnects is not limited to any of particular processes. Examples of such processes include a damascene process, a dual damascene process, and an ordinary process including the steps of: depositing a copper layer; forming a photoresist film serving as a mask; and etching the copper layer using the mask so as to form copper interconnects.

The above and other objects, features and advantages of the present invention will be more apparent from the following description, referring to the accompanying drawings.

DESCRIPTION OF THE PREFERRED EMBODIMENT

Before describing the embodiment of the present invention, the principle of the present invention will be described first for understanding of the present invention. We have studied the cause of an increase in the electric resistance of copper interconnects involved in the damascene process for forming a copper multilevel interconnection structure, and have found the following causes.

According to the conventional damascene process, when a via hole formed in an interlevel dielectric film is filled with tungsten to form a tungsten plug, a photoresist film serving as an etching mask is removed by oxygen plasma ashing while exposing the underlying interconnects to an oxygen plasma ambient.

In this respect, we have found that an exposed surface of the copper interconnects is oxidized to form copper oxide film such as $Cu_2O$ or $CuO$, which causes an increase in the contact resistance between the tungsten plug and the copper interconnects. We have also found that the electric resistance increases in proportion to the thickness of the copper oxide film formed on the exposed surface of the copper interconnects.

We have studied the relationship between a substrate temperature and the thickness of the copper oxide film formed on the copper interconnects, for various values of RF output power per unit area of the substrate. The results are shown in FIG. 2.

Figure 2:
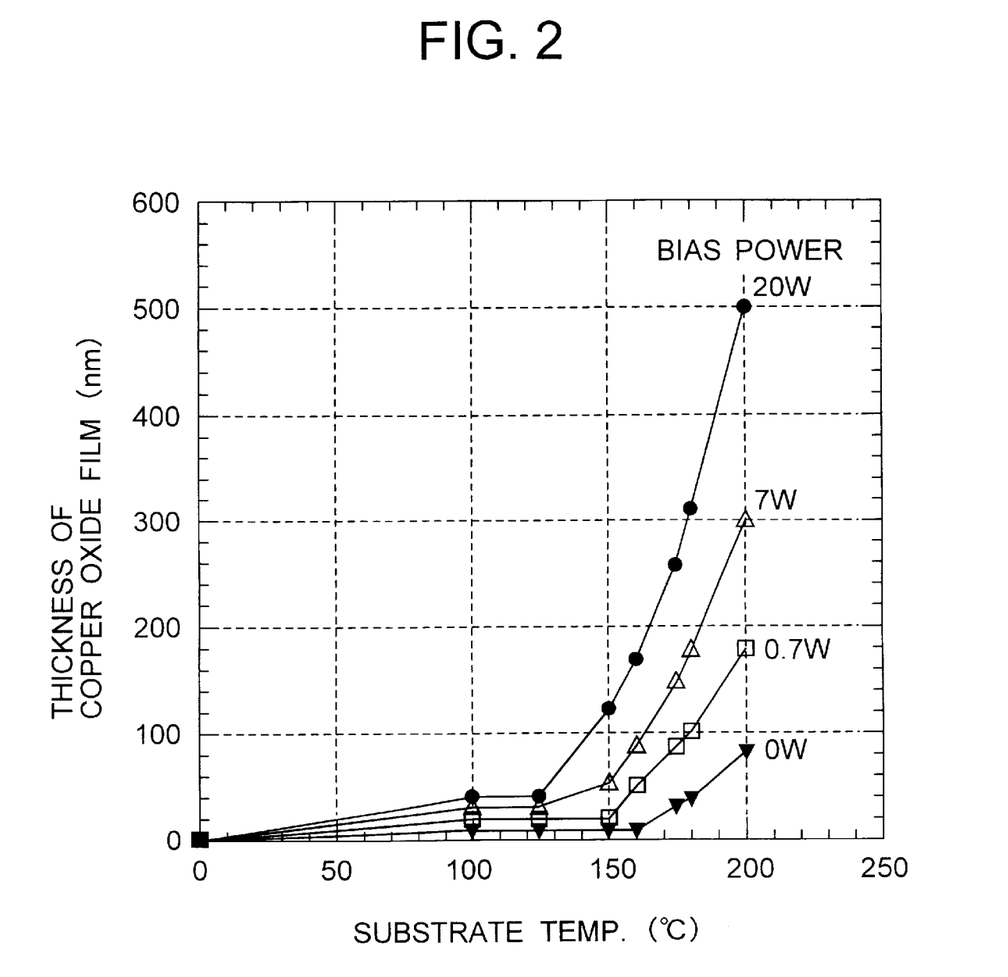
FIG. 2 is a graph showing the general relationship between the substrate temperature and the thickness of a copper oxide film formed during the plasma ashing.

In FIG. 2, when the substrate temperature exceeds 160° C., the thickness of the copper oxide film increases rapidly, irrespective of the RF output power, resulting in an increase in the contact resistance between the copper interconnects and the tungsten plug. In addition, at a given substrate temperature, when the RF output power exceeds 0.7 W/cm$^2$ of the substrate, the thickness of the copper oxide film increases rapidly, resulting in an increase in the contact resistance between the copper interconnects and the tungsten plug. It is to be noted that the illustrated case of an RF output power at 0.0 W is shown simply for the purpose of comparison and is not actually present, since ashing of a photoresist mask does not proceed at an RF output power of 0.0 W.

Figure 3:
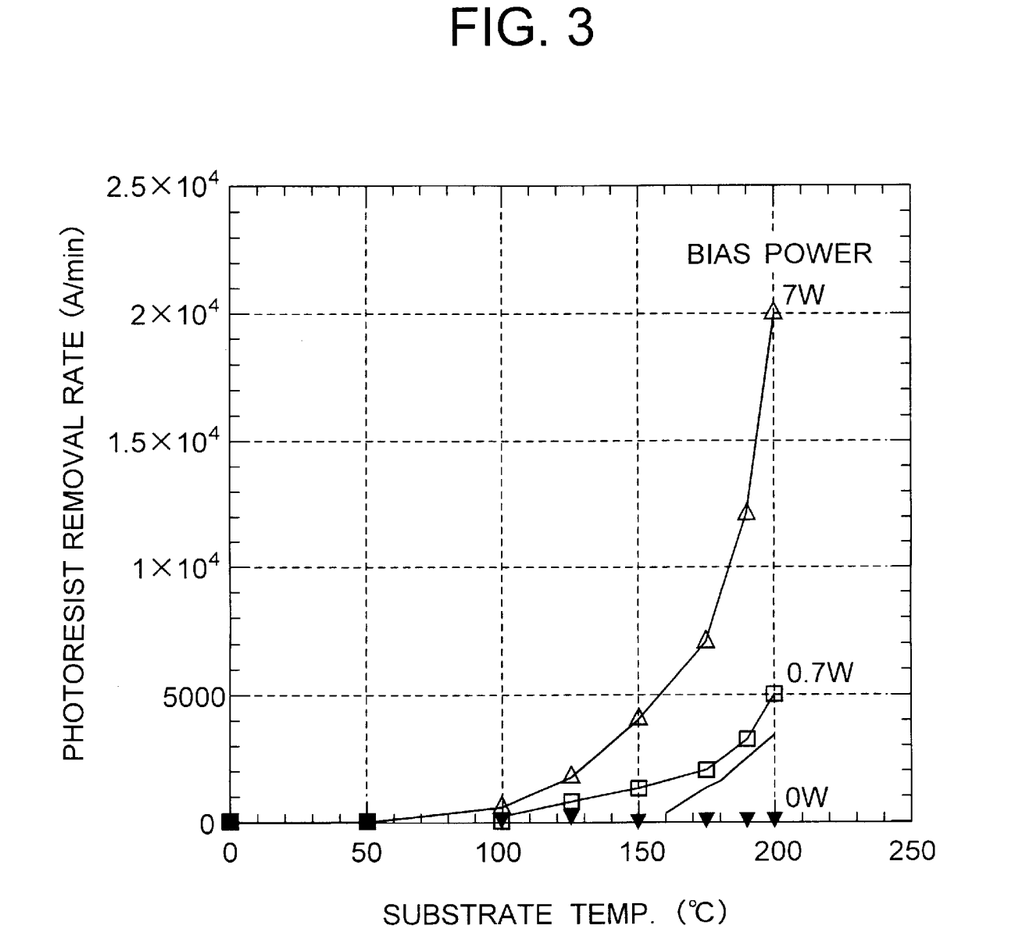
FIG. 3 is a graph showing the general relationship between a photoresist removal rate and a substrate temperature during the plasma ashing.

The lower limit of photoresist removal rate will now be discussed. The photoresist removal rate decreases with the reduction of bias power. FIG. 3 shows that the photoresist removal rate depends on the substrate temperature. Since a typical photoresist film thickness is about 700 nm, the photoresist removal rate decreases to 100 nm/min at a bias power density of 7 W/cm$^2$ and a substrate temperature of not higher than 100° C. In this case, the removal of the photoresist mask takes at least 10 minutes, which is not practical in terms of processing time. Therefore, a practical substrate temperature for photoresist removal ranges from about 100° C. to a temperature lower than 160° C.

Based on the above findings, we have concluded in the present invention that process conditions for removing by oxygen plasma ashing the photoresist film having served as an etching mask should include a substrate temperature which is lower than 160° C., and an RF output power per unit area of the substrate which is not higher than 0.7 W/cm$^2$.

In the process of the present invention for forming a copper interconnect, a method for depositing a copper layer is not particularly limited. Examples of such a method include sputtering, plating, and CVD. The copper purity of the deposited copper layer may be substantially 100%.

The type of a plasma ashing system used in the present invention is not particularly limited. Examples of such a plasma ashing system include a parallel plate type, a downstream type, and an ICP type.

An oxygen pressure in the chamber of the plasma ashing system is preferably as low as possible in view of 1o prevention of copper oxidization so long as oxygen plasma is generated.

Figure 4:
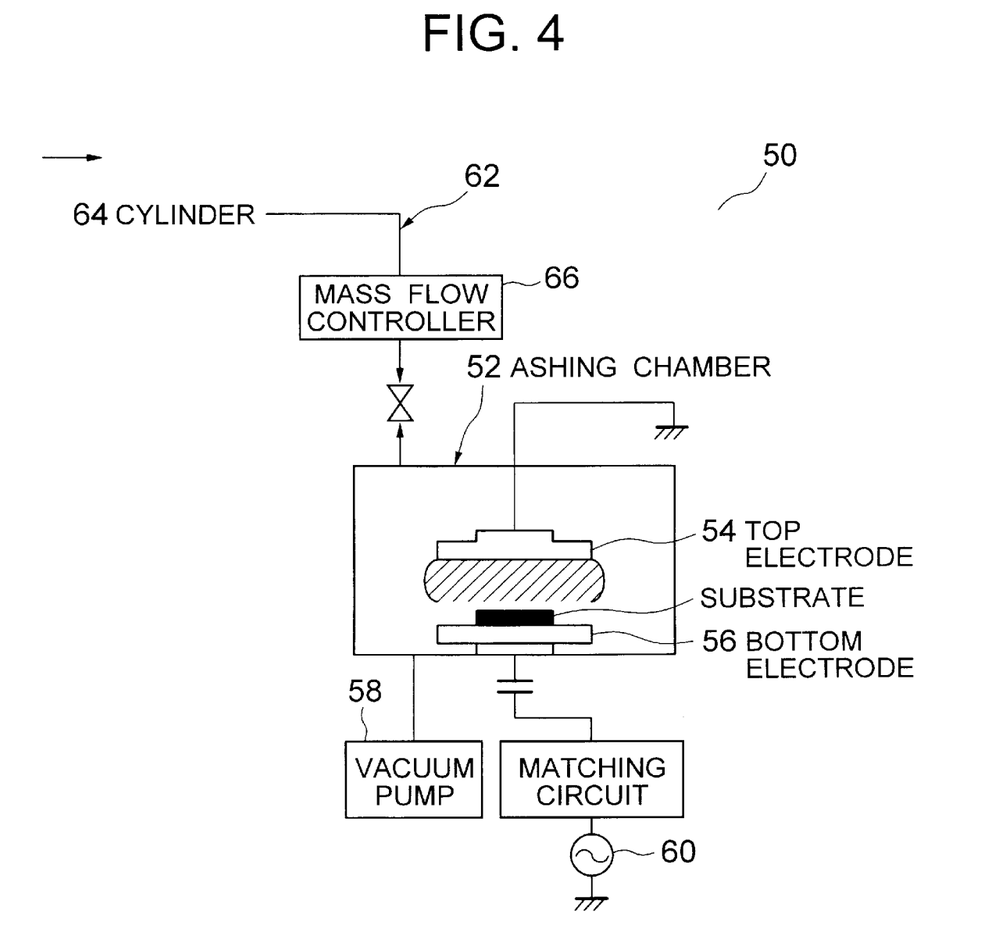
FIG. 4 is a schematic block diagram showing the configuration of a plasma ashing system.

Now, an embodiment of the present invention will be described in detail with reference to the drawings. The present embodiment is directed to a damascene process for fabricating a two-level interconnection structure having interconnects made of copper and having a thickness of 2000 to 3000 angstroms, for example. FIG. 4 schematically shows a plasma ashing system used for performing plasma ashing in the damascene process of the present embodiment.

In FIG. 4, a plasma ashing system 50 is of a parallel plate type and includes an ashing chamber 52, a top electrode 54 of a flat plate type, and a bottom electrode 56 of a flat plate type. The top and the bottom electrodes 54 and 56 are arranged in parallel and received within the ashing chamber 52.

The plasma ashing system 50 further includes a vacuum pump 58 for evacuating the ashing chamber 52, an RF source 60 for applying an RF voltage between the top electrode 54 and the bottom electrode 56, and a gas supply system 62 for supplying a reactive gas into the ashing chamber 52. Plasma is generated between the top electrode 54 and the bottom electrode 56 to subject a wafer disposed on the bottom electrode 56 to plasma ashing.

The gas supply system 62 includes a gas cylinder 64 serving as a reactive gas source and a mass flow controller 66 for controlling the flow rate of the reactive gas.

The process of the present embodiment is described with reference to FIGS. 1A–1I. The process of the present embodiment is similar to a conventional process employed for forming copper interconnects except for ashing conditions employed in an oxygen plasma ashing step and capable of employing a copper plug in place of a tungsten plug in the present embodiment.

As shown in FIG. 1A, a first $SiO_2$ film (e.g., BPSG) 14 is formed on a silicon substrate 12. A via hole (not shown) is formed in the first $SiO_2$ film 14 to expose a portion of diffused region (source/drain region) of the silicon substrate 12. A conductive plug (not shown), such as a tungsten plug, is formed in the via hole to connect the diffused region with an overlying interconnect.

Subsequently, as shown in FIG. 1B, a second $SiO_2$ film 16 is formed on the first $SiO_2$ film 14 by a plasma CVD process. The plasma CVD process uses, for example, silane ($SiH_4$ and oxygen ($O_2$) as reactive gases.

Next, as shown in FIG. 1C, a photoresist film 18 is formed on the second $SiO_2$ film 16. The photoresist film 18 is subjected to patterning by photolithographic and 1o etching steps to be formed into a patterned mask 18 having an interconnect pattern transferred thereto. Subsequently, the second $SiO_2$ film 16 is selectively etched using the patterned mask 18 as an etching mask, thereby forming a wiring trench 20, which has an open top and exposes at the bottom thereof the conductive plug (not shown) formed in the first $SiO_2$ film 14.

The present embodiment uses a photoresist material for the photoresist mask, such as PFI-15 (product of Sumitomo Chemical Co., Ltd.).

Then, the mask 18 is removed by oxygen plasma ashing using a plasma ashing system. If the conductive plug is made of copper, for example, oxygen plasma ashing for removing the mask 18 is performed by use of the plasma ashing system 50 under the following conditions.

Ashing Conditions
  Substrate temperature: 150° C.
  Reactive gas and flow rate: $O_2$/30 sccm
  Chamber pressure: 3 mTorr
  RF output power per unit area: 0.7 W/cm$^2$ Subsequently, as shown in FIG. 1D, a TiN film 22 serving as a barrier layer is blanket-deposited on the wafer. Further, a copper layer 24 is deposited on the TiN film 22 to fill the wiring trench 20.

Then, the copper layer 24 and the TiN film 22 are subjected to a chemical-mechanical polishing (CMP) step until the top of the second $SiO_2$ film 16 is exposed, thereby forming first level copper interconnects 24 in the trench as shown in FIG. 1E. The first level copper interconnects 24 shown therein are in electrical contact with the conductive plugs (not shown) at the bottom portion of the interconnects 24, are exposed at the top surface thereof, and are embedded with the second $SiO_2$ film 16 at both sides of the interconnects 24.

Further, a third $SiO_2$ (e.g., BPSG) film 26 is formed on the second $SiO_2$ film 16. Another photoresist film 28 is formed on the third $SiO_2$ film 26. The photoresist film 28 is subjected to patterning to be formed into a patterned mask 28. Next, as shown in FIG. 1F, the third $SiO_2$ film 26 is etched by an oxygen plasma etching process, thereby forming a via hole 30 which exposes the first level copper interconnects 24. The present embodiment uses a photoresist material for the photoresist mask, such as PFI-15 product of Sumitomo Chemical Co., Ltd.).

Subsequently, the mask 28 is removed by oxygen plasma ashing using the plasma ashing system 50 and under ashing conditions similar to those specified above. During the oxygen plasma ashing process, the top of the first level copper interconnects 24 are exposed to an oxygen plasma ambient through the via hole 30.

Then, as shown in FIG. 1G, a TiN film 32 serving as a barrier layer is blanket-deposited on the entire surface of the wafer, followed by deposition of a copper layer 34 on the TiN film 32.

The TiN film 32 and the copper layer 34 are subjected to a CMP step until the top of the third $SiO_2$ film 26 is exposed, thereby forming a copper plug 34 filling the via hole 30 as shown in FIG. 1H.

Further, a fourth $SiO_2$ film 38 is formed on the third $SiO_2$ film 26 by a plasma CVD process. As in the case of the first copper level interconnects 24, a wiring trench is then formed in the fourth $SiO_2$ film 38. A TiN film 40 is formed on the fourth $SiO_2$ film 38, followed by deposition of a copper layer 42 on the TiN film 40. The TiN film 40 and the copper layer 42 are then subjected to a CMP process to form second level copper interconnects 42.

In order to remove an etching mask after formation of the wiring trench for the second level copper interconnects 42, oxygen plasma ashing is performed using the plasma ashing system 50 and under ashing conditions similar to those employed for removal of the mask 28. During the oxygen plasma ashing process, the copper plug 34 is exposed to an oxygen plasma ambient through the wiring trench.

The above embodiment is described with reference to oxygen plasma ashing removing the entire mask 18 or 28. However, the application of oxygen plasma ashing is not limited thereto. For example, only a top portion of the mask 18 or 28 may be removed by oxygen plasma ashing, and the remaining portion of the mask may be removed using a cleaning solution, such as acetone or any other organic solvent.

Since the above embodiments are described only for examples, the present invention is not limited to the above embodiments and various modifications or alterations can be easily made therefrom by those skilled in the art without departing from the scope of the present invention.

What is claimed is:

1. A method for fabricating a multilevel interconnection structure for a semiconductor device, comprising the steps of forming first level interconnects having a top copper layer and overlying a substrate, forming a first interlayer dielectric film on said first level interconnects, forming a photoresist mask on said first interlayer dielectric film, said photoresist mask having an opening overlying a portion of said first level interconnects, selectively etching said first interlayer dielectric film by using said photoresist mask to form a via hole for exposing said portion of said first level interconnects, removing at least a top portion of said photoresist mask by using a plasma ashing at a substrate temperature lower than 160° C. and a RF power not higher than about 0.7 watts/cm$^2$, and forming second level interconnects connected to said first level interconnects via said via hole.

2. The method as defined in claim 1, wherein said first level interconnects forming step includes depositing a copper layer on an underlying dielectric film having an open trench, and chemical-mechanical polishing said copper layer to leave a portion of said copper layer in said open trench thereby forming said first level interconnects.

3. The method as defined in claim 1 further comprising, before said second level interconnects forming step, the step of forming a via plug filling said via hole for connection of said second level interconnects and said first level interconnects.

4. The method as defined in claim 3, wherein said via plug includes copper.

5. The method as defined in claim 4, wherein said second level interconnects forming step includes the steps of depositing a second interlayer dielectric film on said first interlayer dielectric film, forming another photoresist mask on said second interlayer dielectric film, selectively etching said second interlayer dielectric film using said another photoresist mask to form another trench for exposing at the bottom thereof said via plug, removing said another photoresist mask at a substrate temperature lower than 160° C. and a RF power not higher than about 0.7 watts/cm$^2$ of said substrate, and forming said second level interconnects in said another trench.

6. The method as defined in claim 1, wherein said photoresist mask removing step includes removing a top portion of said photoresist mask by using said plasma ashing and removing a remaining portion of said photoresist mask by using a cleaning solution.

7. The method as defined in claim 1, wherein said photoresist mask removing step removes an entire portion of said photoresist mask.

* * * * *